(12) United States Patent
Park et al.

(10) Patent No.: US 10,673,473 B2
(45) Date of Patent: Jun. 2, 2020

(54) TRANSMITTER AND RECEIVER CIRCUITS

(71) Applicants: SK hynix Inc., Icheon (KR); POSTECH ACADEMY-INDUSTRY FOUNDATION, Pohang (KR)

(72) Inventors: Hong June Park, Pohang (KR); Ji Hoon Lim, Pohang (KR); Hae Kang Jung, Gwangmyeong (KR)

(73) Assignees: SK hynix Inc., Icheon (KR); POSTECH ACADEMY-INDUSTRY FOUNDATION, Pohang (KR)

( * ) Notice: Subject to any disclaimer, the term of this patent is extended or adjusted under 35 U.S.C. 154(b) by 0 days.

(21) Appl. No.: 15/936,230

(22) Filed: Mar. 26, 2018

(65) Prior Publication Data

US 2019/0020363 A1    Jan. 17, 2019

(30) Foreign Application Priority Data

Jul. 11, 2017  (KR) .................. 10-2017-0087662

(51) Int. Cl.
*H04B 1/04* (2006.01)
*H04B 1/16* (2006.01)
*H01L 25/065* (2006.01)

(52) U.S. Cl.
CPC ............ *H04B 1/04* (2013.01); *H04B 1/16* (2013.01); *H01L 25/0657* (2013.01); *H01L 2225/06548* (2013.01); *H04B 2001/0425* (2013.01)

(58) Field of Classification Search
CPC .... H04B 1/04; H04B 1/16; H04L 2225/06548
USPC .......................................................... 375/295
See application file for complete search history.

(56) References Cited

U.S. PATENT DOCUMENTS

| | | | |
|---|---|---|---|
| 8,526,907 B2 * | 9/2013 | Sivonen | H04B 1/109 455/343.1 |
| 2012/0054704 A1 * | 3/2012 | Boecker | H03K 19/00361 716/110 |
| 2014/0176198 A1 * | 6/2014 | Friedman | H03K 19/0019 327/109 |

FOREIGN PATENT DOCUMENTS

| | | | |
|---|---|---|---|
| KR | 1020060100685 A | | 9/2006 |
| KR | 1020160019835 A | | 2/2016 |
| KR | 1020170002219 A | | 1/2017 |

* cited by examiner

*Primary Examiner* — Kevin M Burd

(57) ABSTRACT

A circuit may include a transmitter for generating a signal indicative of input data, an on-chip channel for transmitting the signal from the transmitter, and a receiver comprising a receiving terminal that has a negative resistance value as input resistance of the receiving terminal, the receiver generating a signal indicative of recovered data based on the transmitted signal through the on-chip channel. The circuit may recycle a portion of charge stored in the on-chip channel using charge recycling, and the charge recycling is associated with the negative resistance value of the input resistance.

9 Claims, 5 Drawing Sheets

600A

600B

TRANSMITTER AND RECEIVER CIRCUITS

CROSS-REFERENCE TO RELATED APPLICATION

The present application claims priority to Korean Patent Application No. 10-2017-0087662, filed on Jul. 11, 2017, which is incorporated herein by reference in its entirety.

BACKGROUND

1. Field

Various embodiments of the present disclosure relate to transmitters and receivers, and more particularly, to a circuit including a transmitter and a receiver an on-chip channel, which transmit and receive data between semiconductor chips in a multi-chip package.

2. Description of the Related Art

Development of semiconductor technology has reduced the semiconductor chip area, but has not significantly reduced a number of pins required for communication between semiconductor chips. Furthermore, chip pads and off-chip channel lines are required for communication between semiconductor chips. In order to overcome the limitation in reducing the number of pins, a multi-chip package including a plurality of semiconductor chips in one package has been developed.

Such a multi-chip package includes the same type or different types of chips in one package, and communication is performed within the package. Thus, the multi-chip package transmits and receives data through an on-chip channel including a silicon interposer, a through-silicon via (TSV), or both. The silicon interposer functions to perform communication between semiconductor chips fabricated through a recent process and stacked over a silicon substrate fabricated that may be fabricated using an earlier process. In 2.5D integration using a silicon interposer, the length of an on-chip channel may increase as a result of the number of core semiconductor chips being increased and/or the chip size of the entire package being increased. Such an increase in the length of the on-chip channel may increase parasitic resistance and parasitic capacitance of the on-chip channel. As a result, a bandwidth of the on-chip channel may be reduced while power consumption is increased.

The TSV fabrication refers to a technique for stacking a plurality of semiconductor chips in 3D integration by forming a large number of (for example, several hundred) holes in the stacked semiconductor chips and coupling vertically adjacent semiconductor chips through one or more of electrodes, such that the semiconductor chips can communication with each other. At this time, since a large number of TSVs are used in a bandwidth of several hundred MHz, it is important to reduce power consumption per TSV. In particular, since mobile applications have a battery limit, it is desirable to reduce power consumption per TSV in mobile applications.

Therefore, a transmitter and a receiver for on-chip channel, which can increase a bandwidth for data transmission and reduce power consumption, during communication between semiconductor chips in a multi-chip package is desirable.

SUMMARY

Various embodiments are directed to a circuit including a transmitter and a receiver for an on-chip channel, which is capable of increasing a bandwidth for data transmission and reducing power consumption, during communication between semiconductor chips in a multi-chip package.

In an embodiment, a circuit may include: a transmitter suitable for generating a signal indicative of input data; an on-chip channel suitable for transmitting the signal from the transmitter; and a receiver comprising a receiving terminal that has a negative resistance value as input resistance of the receiving terminal, the receiver being suitable for generating a signal indicative of recovered data based on the transmitted signal through the on-chip channel. The circuit may recycle a portion of charge stored in the on-chip channel using charge recycling, the charge recycling being associated with the negative resistance value of the input resistance.

In an embodiment, a replication circuit corresponding to a circuit that includes an on-chip channel, the replication circuit being suitable for providing differential output signals; a comparator suitable for comparing the differential output signals of the replication circuit; and a control signal generator suitable for generating a control signal in response to the comparison result of the comparator. Each of a receiving terminal of a replication receiver of the replication circuit and a receiving terminal of a receiver of the circuit may be controlled to have a negative resistance value as input resistance, according to the control signal.

In an embodiment, a transmitter suitable for generating a signal indicative of input data; an on-chip channel suitable for transmitting the signal; a receiver having a receiving terminal that has a negative resistance value as input resistance of the receiving terminal, the receiver being suitable for recovering data from the transmitted signal through the on-chip channel; and a process-voltage-temperature (PVT) compensation replication circuit comprising a replication circuit including circuits corresponding to the transmitter, the on-chip channel, and the receiver, respectively, the PVT compensation replication circuit being suitable for controlling a receiving terminal of the receiver and a receiving terminal of a replication receiver of the replication circuit to have a negative resistance value as input resistance.

DETAILED DESCRIPTION

Figure 1:
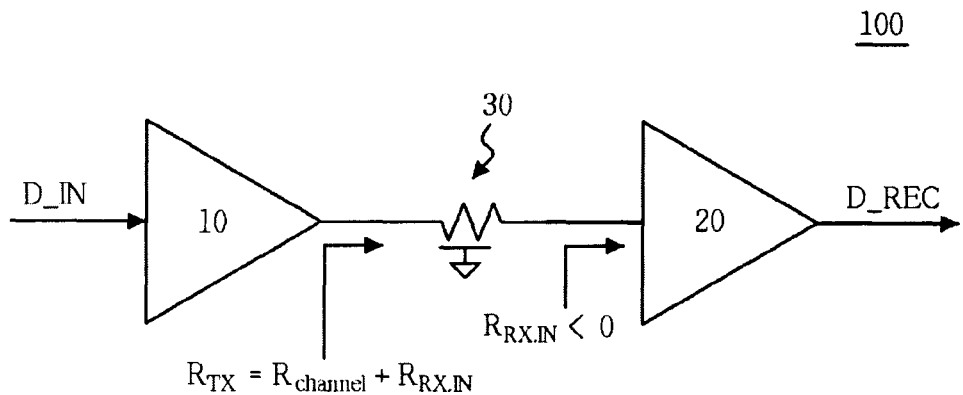
FIG. 1 is a block diagram of a circuit according to an embodiment.

Various embodiments will be described below in more detail with reference to the accompanying drawings. Embodiments of the present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

Moreover, detailed descriptions related to well-known functions or configurations may be omitted for the interest of brevity.

The terms such as first and second may be used to describe various components, but the components are not limited by the terms, and the terms are used only to distinguish one component from another component.

FIG. 1 is a block diagram of a circuit 100 according to an embodiment.

Referring to FIG. 1, the circuit 100 includes a transmitter 10, a receiver 20, and an on-chip channel 30.

The transmitter 10 transmits a signal corresponding to input data D_IN to the on-chip channel 30, and the receiver 20 recovers a transmitted signal through the on-chip channel 30 to generate recovered data D_REC.

The on-chip channel 30 is coupled between the transmitter 10 and the receiver 20 in order to transmit and receive data between semiconductor chips in a multi-chip package. The transmitter 10 and the receiver 20 may be included in each of the semiconductor chips of the multi-chip package. Since the on-chip channel 30 is made of a conductive line having a small thickness (e.g., several micrometers), the on-chip channel 30 has a high resistance value.

Since the on-chip channel 30 has a large loss due to the high resistance value, the on-chip channel 30 substantially removes most of signals caused by reflection from the transmitter 10 and the receiver 20. Therefore, the circuit 100 including the on-chip channel 30 may not need impedance matching and therefore may not have substantially same impedance values of the transmitter 10, the receiver 20, and the on-chip channel 30.

That is, in an on-chip channel environment, an input resistance value of a receiving terminal of the circuit 100 may not have a fixed value, but can be adjusted to a value at which the circuit 100 can exhibit excellent performance in data communication.

In an embodiment, the circuit 100 has a negative resistance value as the input resistance of the receiving terminal of the receiver 20, so that an increase in a current to the receiving terminal produces a decrease in a voltage of the receiving terminal. Since the resistance value of the on-chip channel 30 is considerably high in the on-chip channel environment, the bandwidth of a signal passing through the channel 30 may be significantly reduced. At this time, when the input resistance value of the receiving terminal of the receiver 20 of the circuit 100 is set to a negative resistance value, the negative resistance value may offset the resistance value of the on-chip channel 30, thereby increasing the bandwidth for data transmission.

Therefore, the circuit 100 in accordance with the embodiment of FIG. 1 may transmit a signal at a higher speed than a conventional circuit in the related arts that includes a receiving terminal having a positive input resistance value. As a result, the circuit 100 may increase a voltage margin with the increased bandwidth.

Furthermore, in accordance with an embodiment, a voltage margin required for the receiver 20 to generate the recovered data D_REC is substantially fixed. Thus, the transmitter 10 can reduce power consumption by the voltage margin increased through the bandwidth gain.

In other words, the circuit 100 in accordance with the embodiment of FIG. 1 can reduce the resistance and capacitance value of the on-chip channel 30 by setting the input resistance of the receiving terminal to a negative value, and the power consumption of the transmitter 10 can be reduced by the voltage margin increased through the gain of the bandwidth. Wherein the voltage margin may indicate a difference between a power supply voltage applied to the transmitter 10 and a maximum voltage of an output signal from the transmitter 10.

Figure 2:
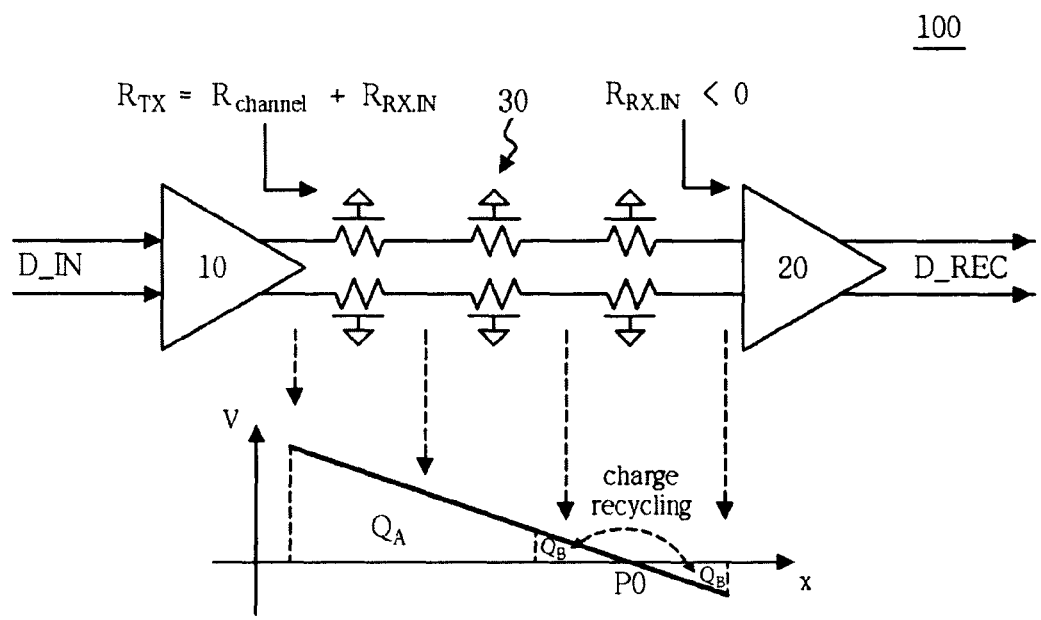
FIG. 2 illustrates charge recycling of a circuit according to an embodiment.

FIG. 2 illustrates charge recycling of the circuit 100 in FIG. 1 according to an embodiment.

Referring to FIG. 2, since the receiving terminal of the circuit 100 has a negative resistance value $R_{RX\_IN}$ as the input resistance value thereof, the negative resistance value may offset the resistance value $R_{channel}$ of the on-chip channel 30 such that the resistance value $R_{TX}$ seen from the transmitter 10 becomes zero at a point P0 between the transmitter 10 and the receiver 20. At the point P0 where the resistance value $R_{TX}$ becomes zero, the swing of a DC voltage becomes zero because the resistance value is zero while a current input/output is present. With respect to the point P0 at which the resistance value $R_{TX}$ becomes zero, voltage polarities at the output terminal of the transmitter 10 and the receiving terminal of the receiver 20 may be opposite to each other.

The transmitter 10 charges or discharges the on-chip channel 30 when transmitting a signal corresponding to the input data D_IN to the receiver 20 through the on-chip channel 30, thereby consuming charge.

At this time, the on-chip channel 30 has a portion in which negative charge is consumed due to the negative input resistance value of the receiving terminal, and the negative charge causes charge recycling, as will be described below in more detail.

The charge consumed by the on-chip channel 30 may be calculated by integrating a difference between a current value transmitted by the transmitter 10 and a current value received by the receiver 20 over a specific time interval. In FIG. 2, x represents a position of the on-chip channel 30 between the transmitter 10 and the receiver 20. For example, the position x of the on-chip channel 30 may be defined as a distance from a transmitting terminal (e.g., transmitting terminals TXP and TXN of the transmitter 10 in FIG. 4) to a receiving terminal (e.g., receiving terminals INP and INN of the receiver 20 in FIG. 4).

As illustrated in FIG. 2, the transmitter 10 consumes only a charge $Q_A$, which is obtained by subtracting a charge $Q_B$ from a charge stored in a portion of the on-chip channel 30 from the transmitting terminal to the point P0, through the charge recycling. For example, the charge recycling uses the charge QB stored in a first portion of the on-chip channel 30 extending the point P0 to the receiver terminal and the charge $Q_B$ stored in a second portion of the on-chip channel 30 extending from the point toward the transmitter 10. The negative input resistance value $R_{RX\_IN}$ of the receiver 20 causes the charge recycling, and thus the transmitter 10 can transmit the signal corresponding to the input data D_IN using a smaller amount of energy, compared to a conventional transmitter coupled to a receiver having a non-negative input resistance value.

The charge QA required for signal transmission by the transmitter 10 may be calculated as expressed by Equation 1 below:

$$Cal.Q_A = \frac{C_{channel}V_{TX}}{2}\left(\frac{R_{channel} + 2R_{RX\text{-}IN}}{R_{channel} + R_{RX\text{-}IN}}\right). \quad \text{[Equation 1]}$$

Figure 3:
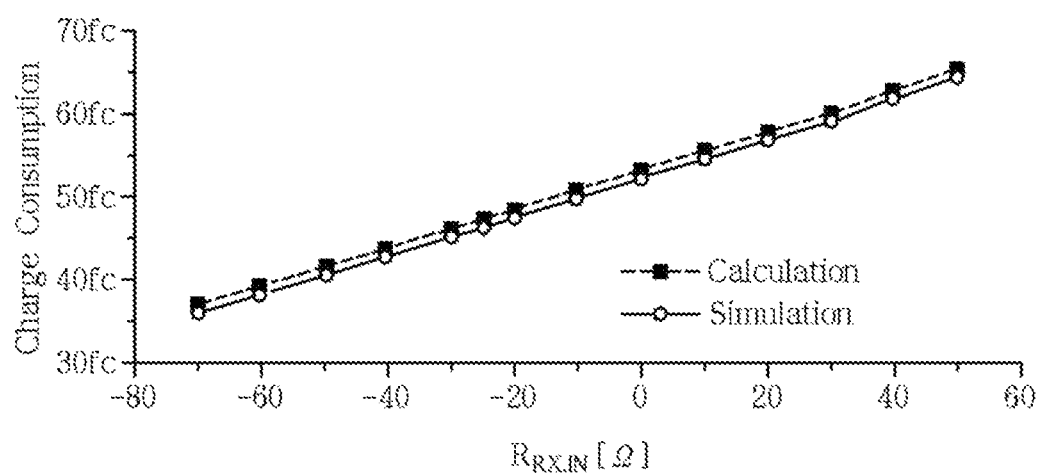
FIG. 3 illustrates calculation and simulation results of charge consumption varying with an input resistance value of a circuit according to an embodiment.

FIG. 3 illustrates calculation and simulation results of consumed charge, which are obtained by changing the input resistance value of the receiver 20.

The consumed charge is obtained by integrating a difference between a current value transmitted by the transmitter 10 and a current value received by the receiver 20 over a time interval. As shown in FIG. 3, the consumed charge is reduced when the input resistance value $R_{RX\_IN}$ is decreased.

Since the negative input resistance value of the receiver 20 causes charge recycling and reduce the consumed charge for transmission of a signal corresponding to the input data D_IN by a given amount (e.g., the charge $Q_B$ in FIG. 2), it is possible to implement the circuit 100 that consumes low energy.

Figure 4:
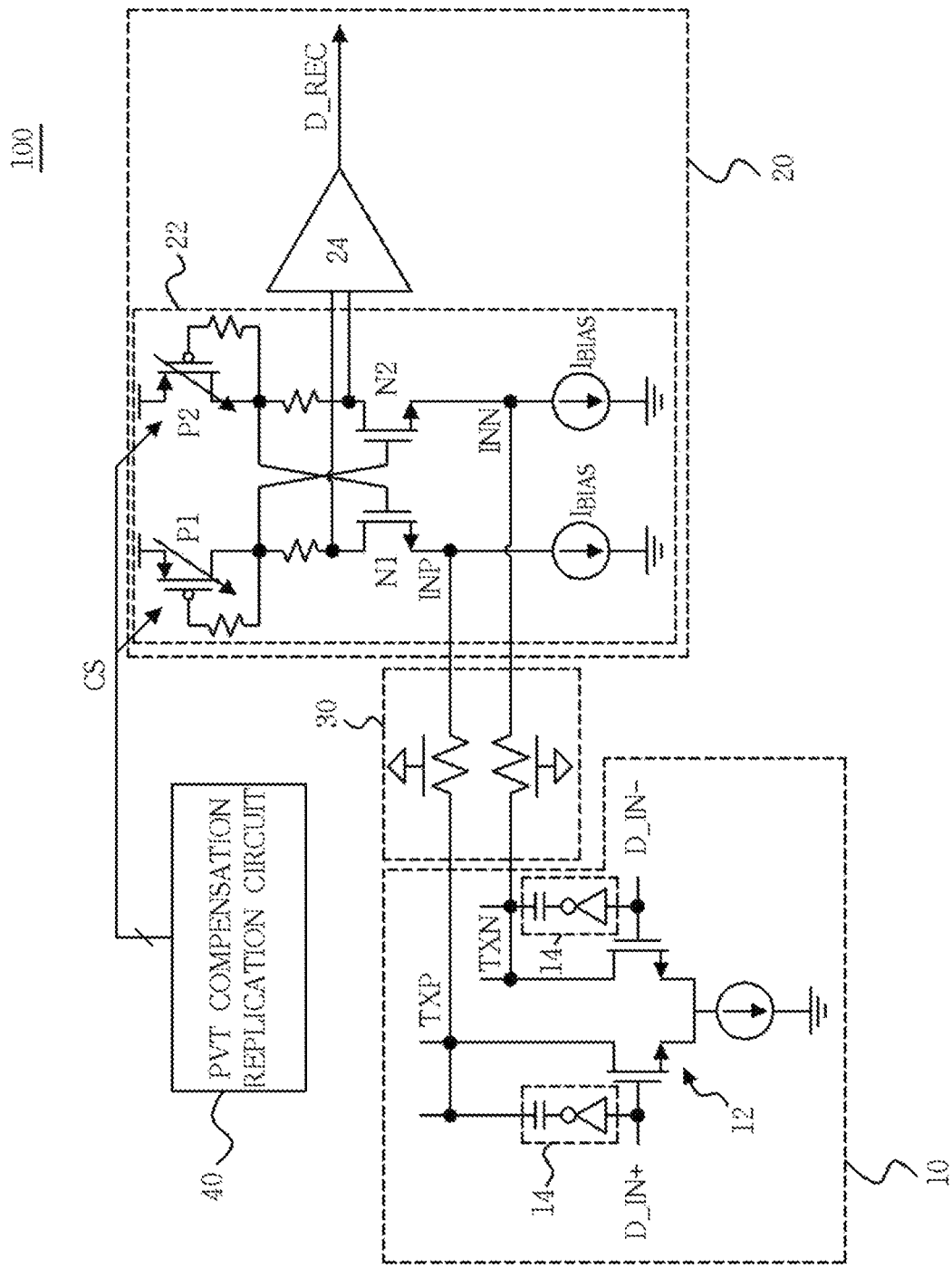
FIG. 4 is a circuit diagram of a circuit according to an embodiment.

FIG. 4 is a block diagram of a circuit 100 according to an embodiment.

Referring to FIG. 4, the circuit 100 includes a transmitter 10, a receiver 20, an on-chip channel 30, and a process-voltage-temperature (PVT) compensation replication circuit 40.

The transmitter 10 includes a current mode driver 12 and a capacitor-type equalizer 14. The current mode driver 12 generates a signal in response to input data D_IN+ and D_IN−, and transmits the signal to the on-chip channel 30. The signal generated by the current mode driver 12 may be a differential signal. The capacitor-type equalizer 14 equalizes signals from output terminals TXP and TXN of the current mode driver 12 in response to the input data D_IN+ and D_IN−.

The receiver 20 includes a transimpedance amplifier (TIA) 22 and a comparator 24. The TIA 22 has a cross-coupled structure, and thus input resistances of receiving terminals INP and INN correspond to (1/gmn−1/gmp), where gmn represents a first transconductance of an NMOS transistor N1 and N2 and gmp represents a second transconductance of a PMOS transistor P1 and P2 of the TIA 22.

Therefore, when the value of a reciprocal of the second conductance 1/gmp is greater than a reciprocal of the first conductance 1/gmn, the input resistances of the receiving terminals INP and INN may have negative resistance values. A transconductance of the PMOS transistors P1 and P2 of the TIA 22 may vary according to an effective size of the PMOS transistors of the TIA 22. Accordingly, the input resistance values of the receiving terminals INP and INN of the receiver 20 can be changed according to the effective size of the PMOS transistors P1 and P2 of the TIA 22.

Figure 6A:
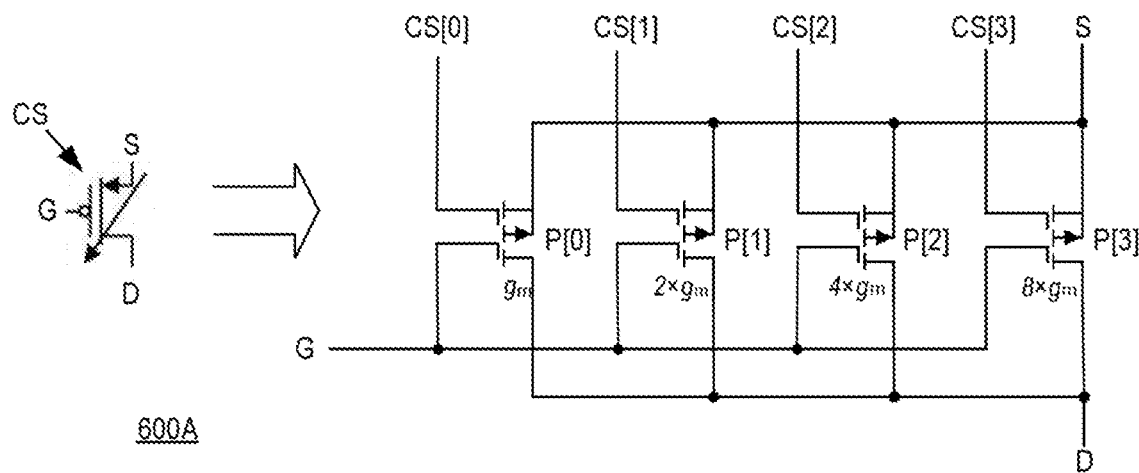
FIG. 6A illustrates an equivalent circuit of a PMOS transistor having a controlled effective size according to an embodiment.
Figure 6B:
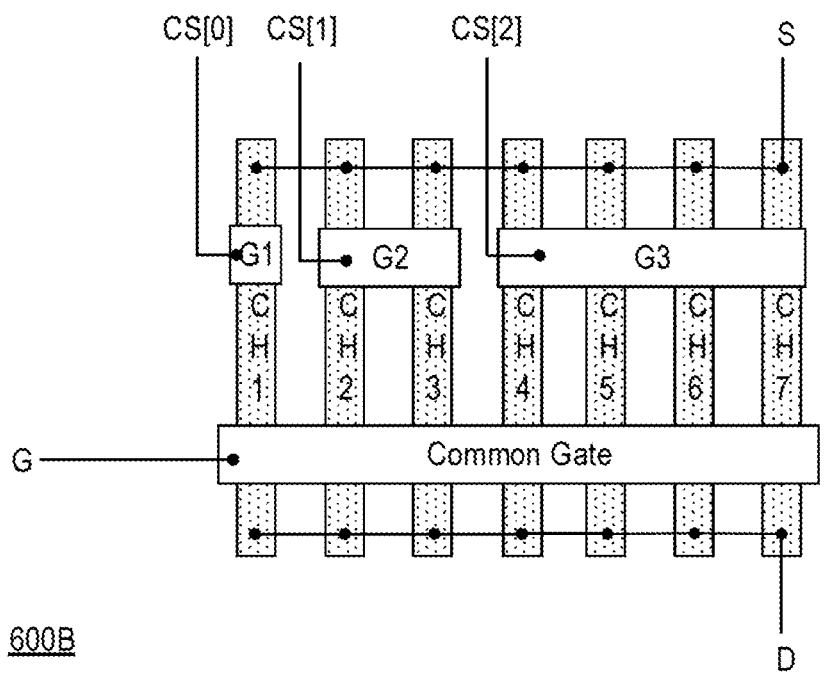
FIG. 6B illustrates a PMOS transistor having a controlled effective size according to an embodiment.

The effective size of the PMOS transistors of the TIA 22 may be adjusted by the PVT compensation replication circuit 40 as will be described later. The PVT compensation replication circuit 40 controls the effective size of a PMOS transistor of the TIA 22 in response to a PVT variation, such that the input resistance values of the receiving terminals INP and INN of the receiver 20 become negative resistance values. For example, the PMOS transistors P1 and P2 overlapped by a diagonal arrow in the TIA 22 includes a plurality of gate terminals that are controlled by a plurality of bits of a control signal CS, respectively, as shown in FIGS. 6A and 6B. As a result, each of the plurality of channels respectively corresponding to the plurality of gate terminals may be active in response to a corresponding bit of the controls signal CS, thereby varying an effective size of the PMOS transistor in the TIA 22 according to the control signal CS.

The TIA 22 amplifies signals received through the receiving terminals INP and INN and outputs the amplified signals to the comparator 24. The comparator 24 compares the output signals of the TIA 22 and generates recovered data D_REC corresponding to the comparison result.

The transmitter 10 may include a driver for multilevel signaling of the input data D_IN, and the receiver 20 may include a recovery circuit for recovering the data D_REC from the multi-level signal. Detailed descriptions a configuration for multilevel signaling of the input data D_IN and a configuration for recovering data from the multi-level signal are omitted herein for the interest of brevity.

The on-chip channel 30 is coupled between the transmitter 10 and the receiver 20 in order to transmit and receive data between semiconductor chips in a multi-chip package. The on-chip channel 30 may include a silicon interposer, a TSV, or both. The silicon interposer functions to perform communication between semiconductor chips fabricated through a recent process and stacked over a silicon substrate fabricated through an earlier process. In this case, the length of the on-chip channel 30 is increased while the number of core semiconductor chips in the multi-chip package is increased or the size of the entire package is increased. Since the increased length of the on-chip channel 30 increases capacitance and resistance of the on-chip channel 30, the on-chip channel 30 has a large loss for a signal transmitting through the on-chip channel 30. Since such a large loss substantially removes signals caused by reflection from the transmitter 10 and the receiver 20, each of the impedance values of the transmitter 10, the receiver 20, and the on-chip channel 30 may not have a fixed value.

Since the on-chip channel 30 has a large loss, most of signals caused by reflection from the transmitter 10 and the receiver 20 may disappear while passing through the on-chip channel 30. Therefore, in an on-chip channel environment, the impedance values of the transmitter 10, the receiver 20, and the on-chip channel 30 may not be adjusted to a predetermined value, as might be done to eliminate or reduce the reflected signals. Since the on-chip channel 30 has a high resistance value, the bandwidth of a signal transmitted from the transmitter 10 through the channel 30 may be significantly reduced. When the resistance value of the on-chip channel 30 may be offset by the negative input resistance value of the receiver 20, the bandwidth of the transmitted signal may be increased. Since the resistance value of the on-chip channel 30 is reduced by the negative input resistance value of the receiver 20, the DC voltage swing for signal transmission of the transmitter 10 can be reduced. And the capacitor-type equalizer 14 of the transmitter 10 can be equalized with a small amount of capacitance due to the reduced DC voltage swing.

The PVT compensation replication circuit 40 adjusts the size of the PMOS transistors P1 and P2 of the receiver 20 in response to a PVT variation, such that the input resistance value of the receiver 20 becomes a negative value. The PVT compensation replication circuit 40 may keep a ratio of an absolute value of the negative input resistance value of the receiver 20 to the positive resistance value of the on-chip channel 30 substantially constant. For example, the PVT compensation replication circuit 40 can adjust the size of the PMOS transistor of the receiver 20 using the control signal CS such that the input resistance value of the receiver 20 is kept substantially equal to −5% of that of the on-chip channel 30, when a PVT variation causes a change in the input resistance value of the receiver 20 and a change in the resistance value of the on-chip channel 30.

The detailed configuration of the PVT compensation replication circuit 40 will be described below with reference to FIG. 5.

Figure 5:
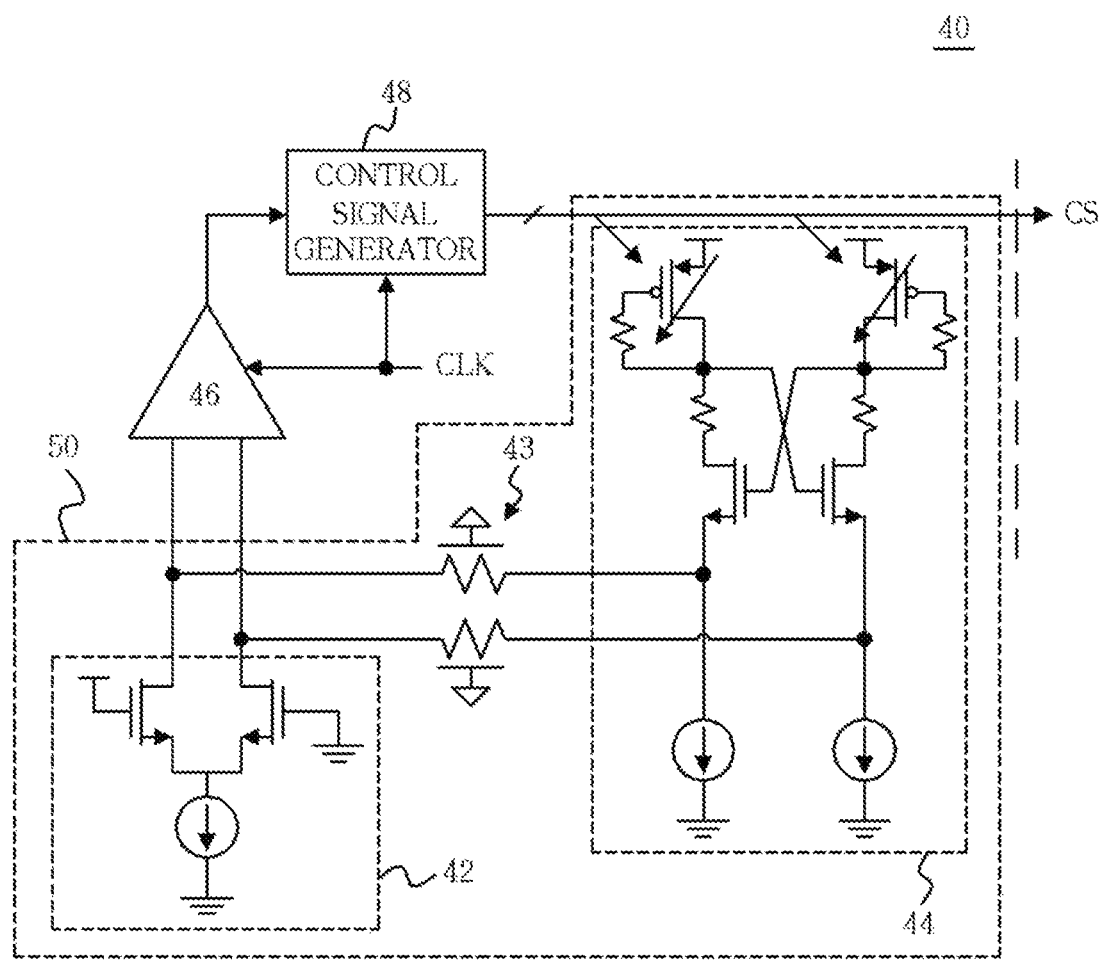
FIG. 5 illustrates a PVT compensation replication circuit of FIG. 4 according to an embodiment.

FIG. 5 illustrates the PVT compensation replication circuit 40 of FIG. 4 according to an embodiment.

Referring to FIG. 5, the PVT compensation replication circuit 40 includes a replication circuit 50, a comparator 46, and a control signal generator 48.

The replication circuit 50 includes a replication transmitter 42, a replication channel 43, and a replication receiver 44, which respectively correspond to the transmitter 10, the on-chip channel 30, and the receiver 20 shown in FIG. 4. In an embodiment, the replication transmitter 42 replicates the transmitter 10 and the replication receiver 44 replicates the TIA 22 of the receiver 20. In the replication circuit 50, the replication channel 43 has a resistance value corresponding to 5% of that of an on-chip channel (e.g., the on-chip channel 30 in FIG. 4).

The comparator 46 compares differential output signals of the replication circuit 50, and provides a signal indicating the comparison result to the control signal generator 48.

The control signal generator 48 generates a control signal CS in response to the signal according to the comparison result of the comparator 46, and provides the control signal CS to the replication receiver 44 and the receiver 20 in FIG. 4. The control signal CS is used for adjusting the size of PMOS transistors of the replication receiver 44 and the receiver 20 such that the replication receiver 44 and the receiver 20 have a negative input resistance value. In an embodiment, the control signal generator 48 is an up-down counter that increases or decreases a value of the control signal CS in response to the clock signal CLK and the output signal from the comparator 46. For example, when the control signal generator 48 receives the output signal being asserted from the comparator 46, the control signal generator 48 increases the value of the control signal CS by one in response to an edge of the clock signal CLK. When the control signal generator 48 receives the output signal being de-asserted from the comparator 46, the control signal generator 48 decreases the value of the control signal CS by one in response to the edge of the clock signal CLK. Each of the PMOS transistors of the replication receiver 44 shown in FIG. 5 includes a plurality of gate terminals, each of which is controlled by a corresponding bit of the control signal CS, as shown in FIGS. 6A and 6B. For example, when the control signal generator 48 is a 10-bit counter, each of the PMOS transistors of the replication receiver 44 includes ten gate terminals that are controlled by 10 bits of the control signal CS, respectively.

The comparator 46 and the control signal generator 48 may operate in synchronization with the same clock signal CLK.

When the input resistance value of the replication receiver 44 is changed by a PVT variation, the PVT compensation replication circuit 40 changes the input resistance value of the replication receiver 44 by adjusting the size of the PMOS transistors of the replication receiver 44.

For example, when the input resistance value of the replication receiver 44 does not correspond to −5% of the resistance value of an actual channel (e.g., the on-time channel 30 in FIG. 4) due to a PVT variation, the comparator 46 compares the differential output signals of the replication transmitter 42, and the control signal generator 48 generates the control signal CS in response to the comparison result of the comparator 46. When the control signal generator 48 adjusts a value of the control signal CS such that the input resistance of the replication receiver 44 becomes substantially equal to −5% of the resistance value of the actual channel, the resistance value at the output terminal of the replication transmitter 42 becomes substantially equal to zero because the resistance value of the replication channel 43 is substantially equal to 5% of the resistance value of the actual channel. In this case, the values of the differential output signals may be substantially identical to each other.

The PVT compensation replication circuit 40 may adjust the size of the PMOS transistors of the replication receiver 44 in response to a PVT variation, such that the values of the differential output signals from the replication transmitter 42 are substantially identical to each other. Thus, the input resistance of the receiver 20 may be kept substantially equal to −5% of the resistance value of the actual channel.

For example, when the absolute value of the negative resistance value of the input resistance of the replication receiver 44 is decreased and the positive resistance value of the on-chip channel 30 in FIG. 4 is increased due to a PVT variation, the positive resistance value of the replication channel 43 is also increased. Because the resistance value seen by the replication transmitter 42 is a sum of the resistance value of the input resistance of the replication receiver 44 and the resistance value of the replication channel 43, the resistance value seen from the replication transmitter 42 becomes positive. As a result, the differential output signals from the replication transmitter 42 have different values, and the comparator 46 generates the output signal being de-asserted. The control signal generator 48 decreases the value of the control signal CS in response to the output signal from the comparator 46, thereby reducing the size of the PMOS transistors of the replication receiver 44. As a result, the absolute value of the negative input resistance value of the replication receiver 44 is increased, thereby making the resistance value seen from the replication transmitter 42 proximate to zero. Thus, the input resistance value of the replication receiver 44 is kept substantially equal to the resistance value of the replication channel 43, which is equal to −5% of the resistance value of the on-chip channel 30, using the control signal CS when the PVT variation occurs. The control signal generator 48 also provides the control signal CS to the receiver 20 in FIG. 4, thereby keeping the input resistance value of the receiver 20 in FIG. 4 substantially equal to −5% of the on-chip channel 30 when the PVT variation occurs.

As such, a circuit (e.g., the circuit 100 in FIG. 4) in accordance with an embodiment can reduce the entire resistance and capacitance value of an on-chip channel (e.g., the on-chip channel 30 in FIG. 4) by configuring the input resistance of the receiving terminal of a receiver (e.g., the receiver 20 in FIG. 4) to have a negative resistance value, thereby increasing the bandwidth of the on-chip channel. Then, the circuit can reduce the power consumption of a transmitter (e.g., the transmitter 10 in FIG. 4) by a voltage margin increased through a gain of the bandwidth.

Furthermore, the circuit in accordance with an embodiment of the present disclosure can reduce the charge consumption required for signal transmission of the transmitter through charge recycling, which results from the negative resistance value set to the input resistance of the receiving terminal. As a result, it is possible to reduce power consumption of a circuit.

FIG. 6A illustrates an equivalent circuit of a PMOS transistor 600A having a controlled effective size according to an embodiment. The PMOS transistor 600A shown may be used as the PMOS transistors P1 and P2 of the TIA 22 of FIG. 4 and as the corresponding PMOS transistors of the receiver 44 of FIG. 5. The PMOS transistor 600A is shown being controlled by a control signal CS[3:0] having four bits, but embodiments are not limited thereto.

Each bit of the control signal CS[3:0] is coupled to a first gate of respective dual independent gate PMOS transistors P[3:0]. Second gates of the dual independent gate PMOS transistors P[3:0] are connected together, the sources of the dual independent gate PMOS transistors P[3:0] are connected together and to a source S of the PMOS transistor 600A, and the drains of the dual independent gate PMOS transistors P[3:0] are connected together and to a drain D of the PMOS transistor 600A.

In an embodiment, a transconductance of the first dual independent gate PMOS transistors P[0] has a value of gm, and transconductances of the second, third, and fourth dual independent gate PMOS transistors P[1], P[2], and P[3] have values of 2 gm, 4 gm, and 8 gm, respectively.

A transconductance of the PMOS transistor 600A, measured to for a gate G, is equal to a sum of the transconductances of the dual independent gate PMOS transistors P[3:0] that are turned on by their respective bits of the control signal CS[3:0]. In an embodiment, a low value on the corresponding bit of the control signal CS[3:0] turns on the dual independent gate PMOS transistors P[3:0], and a high value turns it off.

FIG. 6B illustrates a PMOS transistor 600B having a controlled effective size according to an embodiment. The PMOS transistor 600B is shown being controlled by a control signal CS[2:0] having three bits, but embodiments are not limited thereto.

Each of the bits of the control signal CS[2:0] controls a first gates that controls on or more of a plurality of channels CH1-CH7. The first bit of the control signal CS[0] is connected to a first gate G1 that controls current flow in one channel (CH1), the second bit of the control signal CS[1] is connected to a second gate G2 that controls current flow in two channels (CH2 and CH3), and the third bit of the control signal CS[3] is connected to a third gate G3 that controls current flow in four channels (CH4 to CH7).

A first end of the channels CH1 to CH7 are connected together to form a source S of the PMOS transistor 600B, and a second end of the channels CH1 to CH7 are connected together to form a drain D of the PMOS transistor 600B. A gate G of the PMOS transistor 600B is connected to a common gate that can control current flow through all of the channels CH1 to CH7.

A transconductance of the PMOS transistor 600B, measured for the gate G, is proportional to the number of channels turned on by the control signal CS[2:0]. For example, if CS[2] is low and CS[0:1] are both high, four channels [CH4-CH7] are turned on and the transconductance of the PMOS transistor 600A is equal to 4×gm, where gm is the transconductance when a single channel is turned on. If CS[2] is high and CS[0:1] are both low, three channels [CH1-CH3] are turned on and the transconductance of the PMOS transistor 600A is equal to 3×gm.

In accordance with embodiments of the present disclosure, the input resistance of the receiving terminal of the receiver may be controlled to have a negative resistance value. Thus, the entire resistance and capacitance value of the on-chip channel can be reduced to further increase the bandwidth for data transmission, and the power consumption of the transmitter can be reduced by the voltage margin increased through the gain of the bandwidth.

Furthermore, the charge recycling caused by the negative resistance value of the input resistance of the receiving terminal can reduce the charge consumption required for the signal transmission of the transmitter. As a result, it possible to reduce power consumption of the circuit.

Although various embodiments have been described for illustrative purposes, it will be apparent to those skilled in the art that various changes and modifications may be made without departing from the spirit and scope of the invention as defined in the following claims.

What is claimed is:

1. A circuit comprising:
   a transmitter suitable for generating a signal indicative of input data;
   an on-chip channel suitable for transmitting the signal from the transmitter; and
   a receiver comprising a receiving terminal that has a negative resistance value as input resistance of the receiving terminal, the receiver being suitable for generating a signal indicative of recovered data based on the transmitted signal through the on-chip channel,
   wherein the circuit recycles a portion of charge stored in the on-chip channel using charge recycling, the charge recycling being associated with the negative resistance value of the input resistance, and
   wherein the circuit recycles a channel charge stored in a first portion of the on-chip channel having a first length, the first portion extending from a point at which a resistance value of the on-chip channel becomes zero to the receiving terminal, and a channel charge stored in a second portion of the on-chip channel having substantially the same length as the first length, the second portion extending from the point toward the transmitter.

2. The circuit of claim 1, wherein the transmitter generates the signal having an output voltage swing level, the output voltage swing level being determined by the charge recycling, the signal being differential signals, and performs capacitor-type equalizing on the differential signals.

3. The circuit of claim 1, wherein the receiver comprises a trans-impedance amplifier (TIA) having a cross-coupled structure, and
   wherein the TIA includes a transistor, the negative resistance value of the input resistance being controlled by adjusting a size of the transistor.

4. The circuit of claim 1, further comprising a process-voltage-temperature (PVT) compensation replication circuit suitable for controlling the negative resistance value of the input resistance of the receiving terminal in response to a PVT variation.

5. The circuit of claim 4, wherein the PVT compensation replication circuit comprises:
   a replication circuit including circuits corresponding to the transmitter, the on-chip channel, and the receiver, respectively;
   a comparator suitable for comparing differential output signals of the replication circuit and outputting a comparison signal; and
   a control signal generator suitable for generating a control signal in response to the comparison signal,
   wherein the receiver comprises a trans-impedance amplifier (TIA) having a cross-coupled structure, and
   wherein the TIA includes a transistor, a size of the transistor being adjusted according to the control signal, the negative resistance value of the input resistance being controlled according to the adjusted size of the transistor.

6. The circuit of claim 1, wherein a resistance value seen from the transmitter is a sum of a resistance value of the on-chip channel and the negative resistance value of the receiving terminal.

7. The circuit of claim 1, wherein the transmitter comprises:

a current mode driver suitable for generating the signal indicative of the input data; and
a capacitor-type equalizer suitable for equalizing differential signals at output terminals of the current mode driver.

8. The circuit of claim 1, wherein the receiver comprises:
a trans-impedance amplifier (TIA) suitable for amplifying the signal transmitted through the on-chip channel; and
a comparator suitable for comparing output signals of the TIA, and outputting the recovered data,
wherein the TIA comprises PMOS transistors and NMOS transistors having a cross-coupled structure, and
wherein each of the PMOS transistors of the TIA has an adjustable size, the negative resistance value of the input resistance of the receiving terminal being controlled by adjusting the size of the PMOS transistors.

9. The circuit of claim 1, wherein the transmitter and the receiver are included in one or more semiconductor chips of a multi-chip package, and the on-chip channel comprises a silicon interposer, a through-silicon via (TSV), or both.

* * * * *